(12) United States Patent
Lee et al.

(10) Patent No.: US 11,069,506 B2
(45) Date of Patent: Jul. 20, 2021

(54) DRIVER OF SAMPLE HOLDER FOR ELECTRON MICROSCOPE AND STAGE COMPRISING SAME

(71) Applicant: Korea Basic Science Institute, Yuseong-gu Daejeon (KR)

(72) Inventors: Sang-Chul Lee, Seo-gu Daejeon (KR); Jongman Jeong, Yuseong-gu Daejeon (KR); Jin-Gyu Kim, Yuseong-gu Daejeon (KR); Cheolsu Han, Gyeonggi-do (KR)

(73) Assignee: Korea Basic Science Institute, Yuseong-gu Daejeon (KR)

( * ) Notice: Subject to any disclaimer, the term of this patent is extended or adjusted under 35 U.S.C. 154(b) by 0 days.

(21) Appl. No.: 16/177,213

(22) Filed: Oct. 31, 2018

(65) Prior Publication Data
US 2019/0066970 A1 Feb. 28, 2019

Related U.S. Application Data

(63) Continuation of application No. PCT/KR2017/011785, filed on Oct. 24, 2017.

(30) Foreign Application Priority Data

Oct. 24, 2016 (KR) .......................... 10-2016-0138158

(51) Int. Cl.
*H01J 37/20* (2006.01)
*H01J 37/26* (2006.01)
*G02B 21/24* (2006.01)

(52) U.S. Cl.
CPC ............. *H01J 37/20* (2013.01); *G02B 21/242* (2013.01); *H01J 2237/202* (2013.01); *H01J 2237/26* (2013.01)

(58) Field of Classification Search
None
See application file for complete search history.

(56) References Cited

U.S. PATENT DOCUMENTS

| | | | | |
|---|---|---|---|---|
| 5,568,993 A | * | 10/1996 | Potzick | B23Q 1/5462 403/128 |
| 5,865,063 A | * | 2/1999 | Sheldon | B23Q 1/5462 248/653 |
| 5,901,936 A | * | 5/1999 | Bieg | B23Q 1/5462 248/163.2 |
| 6,940,582 B1 | * | 9/2005 | Tanaka | G03F 7/70225 355/53 |
| 9,741,530 B2 | | 8/2017 | Ominami et al. | |
| 2002/0021428 A1 | * | 2/2002 | Nakano | H01J 37/20 355/53 |

(Continued)

FOREIGN PATENT DOCUMENTS

| | | | | |
|---|---|---|---|---|
| JP | H03-129654 A | 6/1991 | | |
| JP | 10138177 A | * 5/1998 | ............... | B23Q 1/54 |

(Continued)

*Primary Examiner* — Michael J Logie
(74) *Attorney, Agent, or Firm* — Todd B. Alder (57) ABSTRACT

A sample stage includes a sample holder that accommodates a sample and a first drive module, a second drive module, and a third drive module that are radially connected to the sample holder and allow the sample holder to have translational degrees of freedom in three directions and rotational degrees of freedom in at least two directions.

6 Claims, 9 Drawing Sheets

(56) References Cited

U.S. PATENT DOCUMENTS

| | | | |
|---|---|---|---|
| 2005/0035684 A1 | 2/2005 | Fuse et al. | |
| 2007/0063148 A1* | 3/2007 | Miyazaki | H01J 37/20 250/442.11 |
| 2008/0304142 A1 | 12/2008 | Klinkhamer | |
| 2009/0211390 A1* | 8/2009 | Brogardh et al. | B25J 17/00 74/490.03 |
| 2013/0319157 A1 | 12/2013 | Yang | |

FOREIGN PATENT DOCUMENTS

| | | | | |
|---|---|---|---|---|
| JP | 2004031537 A | 1/2004 | | |
| JP | 4166934 B2 | 10/2008 | | |
| JP | 2012056045 A | 3/2012 | | |
| KR | 10-20090010771 A | 1/2009 | | |
| KR | 10-1164378 B1 | 7/2012 | | |
| KR | 101411095 B1 * | 6/2014 | | B25J 9/06 |
| KR | 20150104574 A | 9/2015 | | |
| KR | 101604055 B1 | 3/2016 | | |
| KR | 20160079010 A | 7/2016 | | |
| WO | WO-2016052776 A1 * | 4/2016 | | H01J 37/20 |

\* cited by examiner

DRIVER OF SAMPLE HOLDER FOR ELECTRON MICROSCOPE AND STAGE COMPRISING SAME

CROSS-REFERENCE TO RELATED APPLICATIONS

This application is a continuation of International Application No. PCT/KR2017/011785, filed on Oct. 24, 2017, which claims the benefit of Korean Patent Application Serial No. 10-2016-0138158 filed on Oct. 24, 2016, each of which is incorporated herein by reference

BACKGROUND

An electron microscopy may scan and transmit electrons with shorter wavelengths as compared to photons and make an enlarged image of the sample using an image acquired by measuring or penetrating the electrons interacted with the sample. An operating principle of the electron microscope differs depending on a type. For example, in one method an electron beam is transmitted through a sample or focused on a point on a surface of a sample, which is then collected by a detector to acquire an image.

DESCRIPTION OF EMBODIMENTS

In one example, the present disclosure provides a driver of a sample holder for an electron microscope and a stage including the driver and, more particularly, to a driver that drives a holder supporting a sample at five degrees of freedom so that the sample is easily observed in various directions and is disposed outside a sample in-and-out area so as not to interfere with the sample moving in and out, thereby efficiently driving the holder even in a small space and reducing a manufacturing cost of an electron microscope, and a stage including the driver.

The sample may be inserted and fixed on the supporting stage to be observed. During observation with the electron microscope, the sample may need to be tilted or to translationally moved in order to observe surfaces or places of the sample. For this, a stage for the electron microscope may include a driver to drive a sample holder that supports the sample in the stage. The sample holder supporting the sample in the stage may be designed to implement various degrees of freedom for tilting and translational movement of the sample. In one example, the sample holder may be provided externally to an entrance so as not to interfere with the sample being inserted or removed.

To implement the multi-degrees-of-freedom motion, a device that implements a 6-degree of freedom such as the well-known Stewart platform may be considered. The device may be useful for rotating and translating a sample. However, the volume is too large to be mounted inside the electron microscope, which is practically impossible, and it is not suitable to be used because it may occupy a movement path for inserting and removing the sample. Also, the production cost may be excessively high.

Another issue with typical sample holders is that typical holders directly connect the sample holder to a rotating motor shaft to translate the sample along an arc path in order to translate the sample. However, because this is not a translational motion of a straight line, a positional error may be generated by an interval between the straight line and the arc, which may prevent an observer from moving the sample to an exactly desired position.

In order to simplify a design of a driving mechanism, it may be considered to install a high-complexity drive mechanism part in a vacuum electron microscope barrel and configure a vacuum type driver to move the sample. However, the production cost may be high, and completeness or precision of driving may not be ensured.

The present disclosure provides a simple type of driver for driving a sample holder to have a high degree of freedom. In some examples, a driver can also be provided that may be implemented in an external space so as not to occupy the entrance of the sample, for example, a space outside a column supporting the sample holder. Also, such driver may be capable of sufficient movement and rotation in a narrow space inside the electron microscope barrel in consideration of an appropriate production cost and a simplicity of the manufacturing process.

An embodiment provides a driver of a sample holder for an electron stereoscope and a stage including the driver, wherein the driver may drive the sample holder that supports at a high degree of freedom to easily observe various aspects of the sample.

Another embodiment provides a driver of a sample holder for an electron stereoscope and a stage including the driver, wherein the driver may be provided outside an entrance to efficiently drive the sample holder in a small space and may not occupy the entrance so as not to interfere with the sample being inserted and removed.

Still another embodiment provides a driver of a sample holder for an electron stereoscope and a stage including the driver, which may ensure completeness and precision of driving, and a low production cost.

Accordingly, in one embodiment there is provided a sample stage including a sample holder configured to accommodate a sample, a first drive module, a second drive module, and a third drive module, wherein the first drive module, the second drive module, and the third drive module are radially connected to the sample holder to allow the sample holder to have translational degrees of freedom in three directions and rotational degrees of freedom in at least two directions.

Each of the first drive module, the second drive module, and the third drive module may include a connection bar ball-jointed to each of three different portions of the sample holder, an upper link assembly, and a lower link assembly, and the upper link assembly and the lower link assembly may be respectively hinged to an upper side and a lower side of the connection bar to tilt the connection bar in a vertical direction.

One of the upper link assembly and the lower link assembly may include two segmental links hinged to each other, and the other one of the upper link assembly and the lower link assembly may include three segmental links hinged to one another.

The five segmental links may move on the same two-dimensional (2D) plane.

The sample stage may further include a chamber configured to enclose the sample holder, the upper link assembly may include an upper sliding link configured to slidably move relative to the chamber and an upper connection link having one side hinged to the connection bar and the other end hinged to the upper sliding link, and the lower link assembly may include a lower sliding link configured to slidably move relative to the chamber, a lower connection link having one side hinged to the lower side of the connecting bar, and an intermediate link having one side hinged to the lower connection link and the other side hinged to the lower sliding link.

A rotation axis between the upper connection link and the connection bar may be orthogonal to a rotation axis between the upper connection link and the upper sliding link.

A rotation axis between the lower connection link and the connection bar may be orthogonal to a rotation axis between the lower connection link and the intermediate link, and orthogonal to a rotation axis between the intermediate link and the lower sliding link.

According to another aspect, there is also provided a driver of a sample holder for an electron microscope, wherein the driver is connected to a sample holder that holds a sample to drive the sample holder, and includes pairs of a plurality of link assemblies to drive the sample holder by a synchronized motion of the pairs of the plurality of link assemblies or a relative motion of the pairs of the plurality of link assemblies.

The plurality of link assemblies may be radially connected to the sample holder.

A number of the link assemblies may be six, and two link assemblies may be included in each pair.

A position of the sample holder may be adjusted by the synchronized motion of the pairs of the plurality of link assemblies.

A posture of the sample holder may be adjusted by the relative motion of the pairs of the plurality of link assemblies.

Each of the pairs of the plurality of link assemblies may include four segmental links sequentially connected to be relatively rotatable, and the driver may further include a connection bar having one end rotatably connected to one of two intermediately connected links among the four segmental links and the other end pivotably connected to the sample holder.

The connection bar may be ball-jointed to the sample holder.

The driver may implement at least 3 translational degrees of freedom and 2 rotational degrees of freedom.

Effects

According to example embodiments, it is possible to drive a holder supporting a sample at a high degree of freedom to easily observe various aspects of the sample.

According to example embodiments, it is possible to provide a driver outside an entrance to efficiently drive a sample holder in a small space while not occupying an entrance so as not to interfere with a sample being inserted and removed.

According to example embodiments, it is possible to provide a driver of a sample holder for an electron stereoscope and a stage in including the driver, which ensures completeness and precision of driving, and a low production cost.

The effects are not limited to those mentioned above, and other effects may be clearly understood by those skilled in the art from the following description.

Hereinafter, example embodiments will be described in detail with reference to the accompanying drawings. Regarding the reference numerals assigned to the elements in the drawings, it should be noted that the same elements will be designated by the same reference numerals, wherever possible, even though they are shown in different drawings. Also, in the description of embodiments, detailed description of well-known related structures or functions will be omitted when it is deemed that such description will cause ambiguous interpretation of the present disclosure.

Terms such as first, second, A, B, (a), (b), and the like may be used herein to describe components. Each of these terminologies is not used to define an essence, order or sequence of a corresponding component but used merely to distinguish the corresponding component from other component(s). It should be noted that if it is described in the specification that one component is "connected," "coupled," or "joined" to another component, a third component may be "connected," "coupled," and "joined" between the first and second components, although the first component may be directly connected, coupled or joined to the second component.

Figure 1:
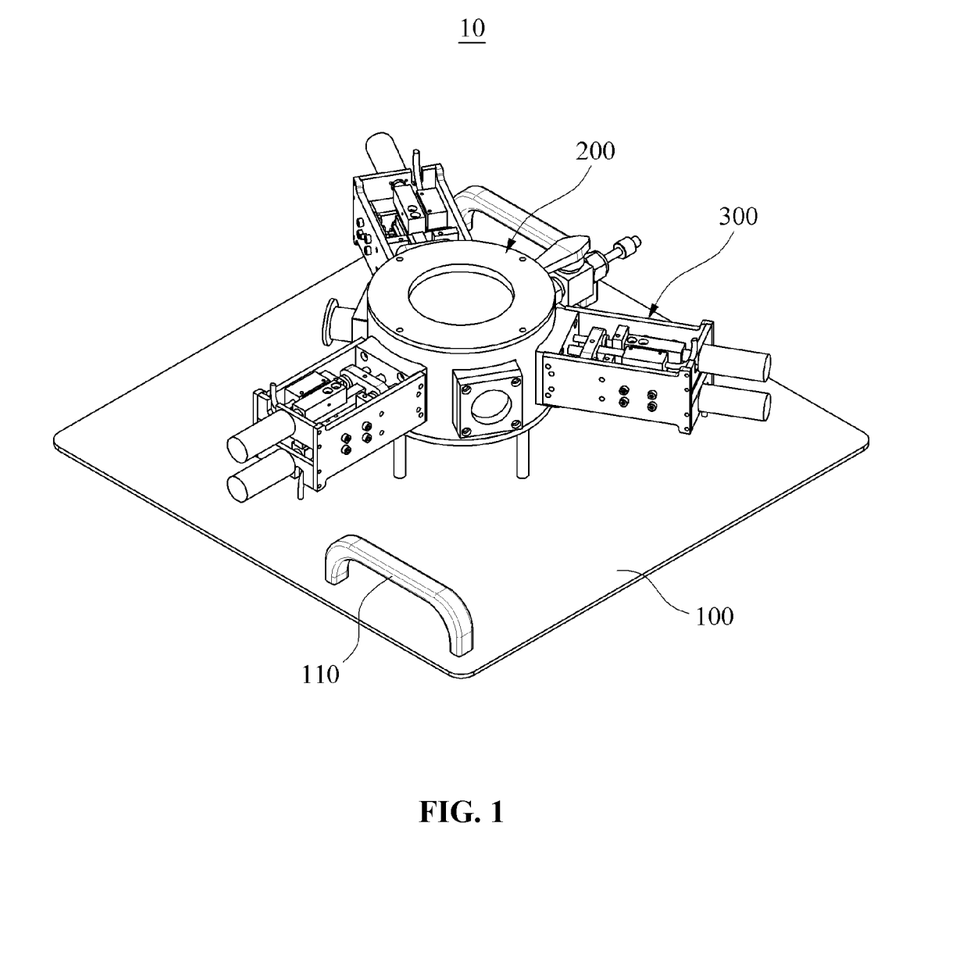
FIG. 1 is a perspective view illustrating a stage for an electron microscope according to an example embodiment.

FIG. 1 is a perspective view illustrating an stage for an electron microscope according to an example embodiment.

Figure 2:
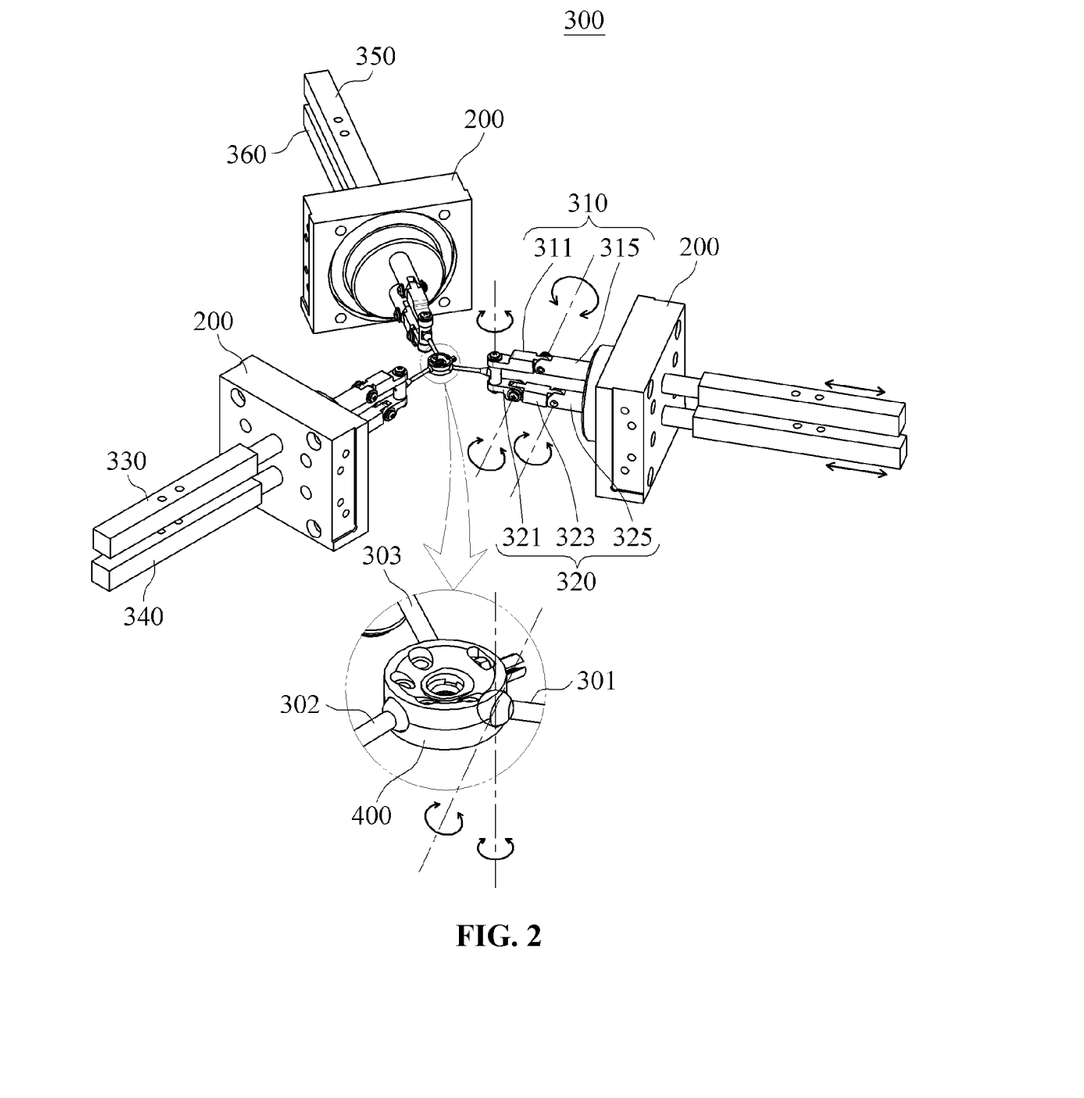
FIG. 2 is a perspective view illustrating a driver according to an example embodiment.

Referring to FIG. 1, a stage 10 may drive a sample holder 400 of FIG. 2 located inside a chamber 200 at 5 degrees of freedom (D.O.F) including 3 translational degrees of freedom and 2 rotational degrees of freedom and related description will be described in detail later. The stage 10 may perform tilting motions in all direction based on an observation point of a sample and implement 5 degrees of freedom even in a vertically small space. For example, when the stage 10 is installed in a space between two pole pieces of 15 millimeters or less, all directional tilting is possible based on a user's desired observation point on a sample. Thus, in comparison to typical single tilt-rotation holders and double-tilt holders, an issue that an observation point deviates from a beam axis when the sample is tilted may be solved.

The chamber 200 may include the sample holder 400, so that the sample holder 400 is driven by three driving modules connected radially. The three driving modules may include three connecting bars 301, 302, and 303 and six link assemblies 310, 320, 330, 340, 350, and 360, each having one end penetrating the chamber 200 to be connected to the sample holder 400 through the corresponding connecting bar and the other end connected to a motor fir reciprocating a link.

Each of the link assemblies 310, 320, 330, 340, 350, and 360 may include a location sensor to measure a movement thereof. The sensor, the link, the motor and the like may be attached externally instead of a lower portion of the sample holder in the chamber and thus, may not interfere with the sample being inserted and removed.

A driver will be described with reference to FIG. 2. FIG. 2 is a perspective view illustrating a driver according to an example embodiment. The sample holder 400 may include the three connecting bars 301, 302, and 303 and the six link assemblies 310, 320, 330, 340, 350, and 360 connected thereto.

Each of the connecting bars 301, 302, and 303 may have one end pivotally moving relative to the sample holder 400. The one end of each of the connecting bars 301, 302, and 303 may be, for example, ball-jointed to the sample holder 400 to be tilted relative to the sample holder 400 in at least two directions.

The other end of each of the connecting bars 301, 302, and 303 may be hinged to be horizontally rotatable about two link assemblies connected to an upper side and a lower side of the corresponding connecting bar. Here, the two link assemblies connected to the upper side and the lower side of the corresponding connecting bar may be referred to as, for example, a pair of link assemblies. In the pair of link assemblies, the link assembly connected to the upper side, for example, the link assemblies 310, 330, and 350 may also be referred to as an upper link assembly, and the link assembly connected to the lower side, for example, the link assemblies 320, 340, and 360 may also be referred to as a lower link assembly.

As discussed above, the six link assemblies 310, 320, 330, 340, 350, and 360 may be connected to the motor to implement a translational movement. Also, the connecting bar connected to the pair of link assemblies may rotatably move in a vertical direction in response to a relative movement of the pair of link assemblies.

The six link assemblies 310, 320, 330, 340, 350, and 360 of a driver 300 may penetrate the chamber 200 and support the sample holder 400, thereby implementing 5 degrees of freedom for controlling a position and a posture, and related description will be made as follows.

Figure 3:
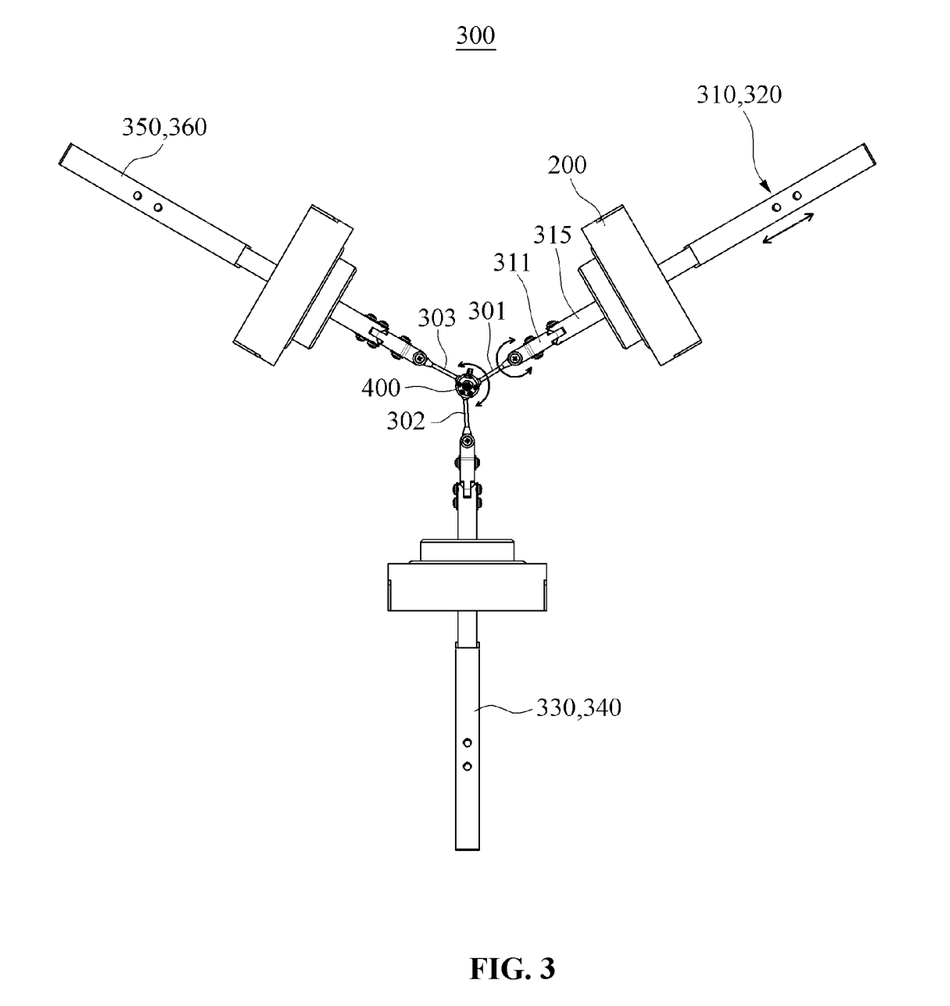
FIG. 3 is a diagram illustrating a position implementing principle according to an example embodiment.

A motion of the driver 300 will be further described with reference to FIGS. 3 and 4. FIG. 3 is a diagram illustrating a position implementing principle according to an example embodiment and FIG. 4 is a diagram illustrating a posture implementing principle according to an example embodiment.

Referring to FIG. 3, the position implementing principle will be described as follows. The six link assemblies 310, 320, 330, 340, 350, and 360 may change a position of the sample holder 400 connected thereto while performing a translational movement. For example, when a pair of first and second link assemblies 310 and 320, a pair of third and fourth link assemblies 330 and 340, and a pair of fifth and sixth link assemblies 350 and 360 perform the translational movement through synchronization, the sample holder 400 may move on a plane to be positioned at a desired position in response thereto. In other words, when a pair of link assemblies are synchronized and moved, the translational movement may occur due to a positional difference between the link assemblies such that the position of the sample holder 400 is changed.

Figure 4:
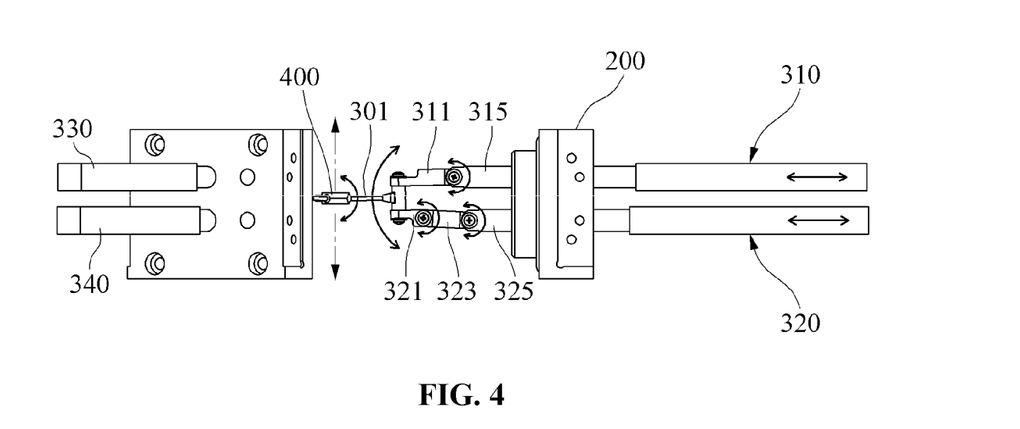
FIG. 4 is a diagram illustrating a posture implementing principle according to an example embodiment.

Referring to FIG. 4, the posture implementing principle will be described as follows. When the pair of link assemblies 310-320 moves, a relative positional difference may occur, which may lead to a motion of the connecting bar 301 connected to the pair of link assemblies 310-320 moving up and down. Likewise, when the pair of link assemblies 330-340 and the pair of link assemblies 350-360 moves, motions of the connecting bars 302 and 303 connected to the sample holder 400 may occur so that a posture of the sample holder 400 is determined. In this example, the connecting bars 301, 302, and 303 may be ball-jointed to the sample holder 400.

One of the upper link assembly 310 and the lower link assembly 320, for example, the upper link assembly 310 may include two segmental links 311 and 315, and the other one, for example, the lower link assembly 320 may include three segmental links 321, 323, and 325. The five segmental links 311, 315, 321, 323, and 325 may move on the same two-dimensional (2D) plane, for example, a plane of FIG. 4.

The upper link assembly 310 may include an upper sliding link, for example, the segmental link 315 configured to slidably move relative to the chamber 200 and an upper connection link, for example, the segmental link 311 having one side hinged to the connection bar 301 and the other end hinged to the upper sliding link 315. The lower link assembly 320 may include a lower sliding link, for example, the segmental link 325 configured to slidably move relative to the chamber 200, a lower connection link, for example, the segmental link 321 having one side hinged to the lower side of the connecting bar 301, and an intermediate link, for example, the segmental link 323 having one side hinged to the lower connection link 321 and the other side hinged to the lower sliding link 325. A rotation axis between the upper connection link 311 and the connecting bar 301 may be orthogonal to a rotation axis between the upper connection link 311 and the upper sliding link 315. Also, a rotation axis between the lower connection link 321 and the connecting bar 301 may be orthogonal to a rotation axis between the lower connection link 321 and the intermediate link 323 and orthogonal to a rotation axis between the intermediate link 323 and the lower sliding link 325. In the above-described structure, the five segmental links 311, 315, 321, 323, and 325 may move on the same 2D plane, for example, the plane of FIG. 4. Also, it can be known that the position and the posture of the sample holder 400 are adjusted through an inverse kinetic analysis as described with reference to FIGS. 5 through 11.

In practice, a relative motion may not occur between the upper connection link 311 and the lower connection link 321 and thus, the upper connection link 311 and the lower connection link 321 may be understood as one link. Also, it may be understood that the pair of link assemblies 310-320 includes four segmental links 315, 311-321, 323, and 325 sequentially connected to be relatively rotatable. In this case, one end of the connecting bar 301 may be rotatably connected to a link 311-321 between two intermediately connected links 311-321 and 323 among the four segmental links 315, 311-321, 323, and 325 and the other end may be pivotably connected to the sample holder 400.

A motion of a driver will be further described based on the inverse kinematics with reference to FIGS. 5 through 11.

Figure 5:
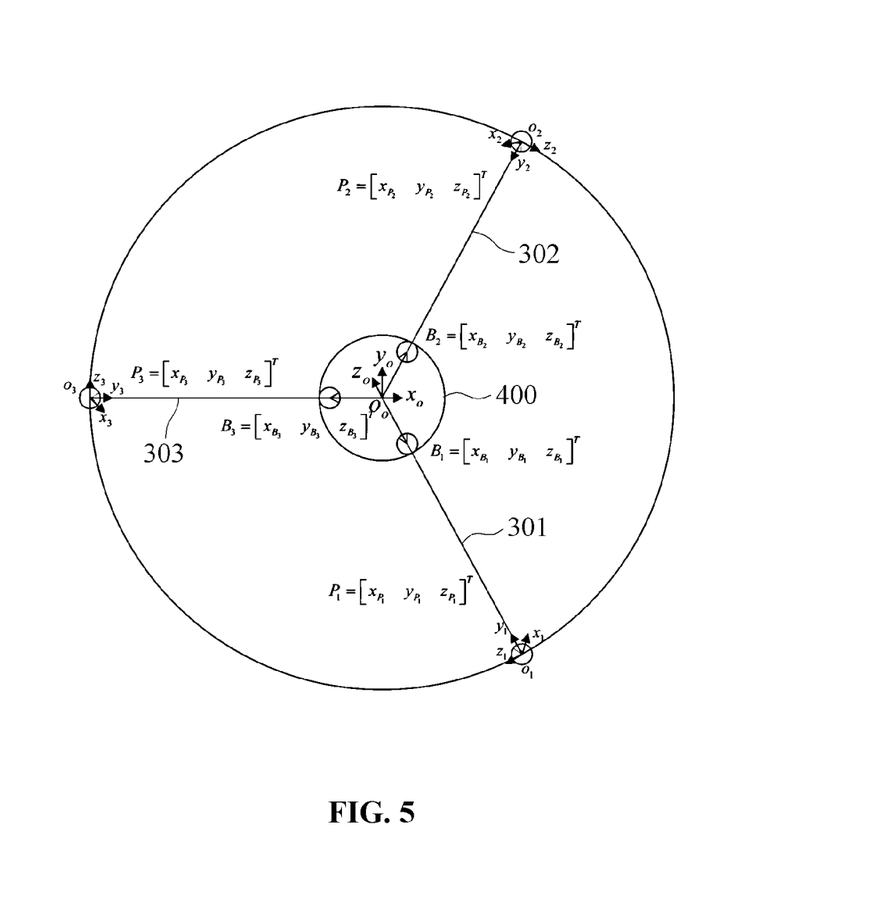
FIG. 5 is a top view illustrating a driver with coordinates according to an example embodiment.

FIG. 5 is a top view illustrating a driver with coordinates according to an example embodiment. In FIG. 5, symbols may be defined as follows.

1) Coordinate system $[o_o, x_o\ y_o\ z_o]^T$ a global coordinate system used tor representing the entire stage, wherein a center $o_o$ is a home position of a sample and corresponds to a center point of the entire stage.

2) Vector $B_i = [o_{B_i} x_{B_i} y_{B_i} z_{B_i}]^T$, (i=1, 2, 3): $B_i$ is a vector that represents a position of a ball joint of an i-th connecting bar connected to a sample holder based on the center $o_o$.

3) Coordinate system $[o_i\ x_i\ y_i\ z_i]^T$, (i=1, 2, 3): a local coordinate system fixed to a link assembly and located at a center point of the i-th link assembly in contact with an inner wall of a chamber and a link assembly, for example, a lower one of the two link assemblies used to determine a position of the sample holder, wherein an axis $x_i$ is in a chamber inner wall's tangent line direction and $y_i$ is in a chamber center direction.

4) Vector $P_i = [x_{P_i} y_{P_i} z_{P_i}]^T$, (i=1, 2, 3): $P_i$ is a vector that represents a position of an origin $o_i$ of the local coordinate system fixed to the link assembly based on the center $o_o$.

Figure 6:
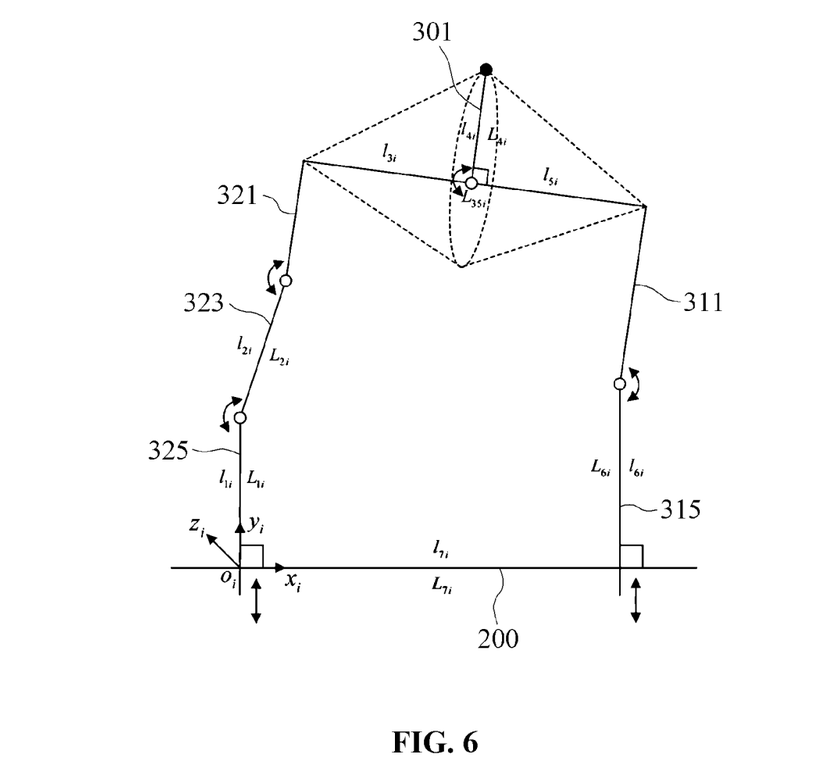
FIG. 6 is a side view illustrating a link assembly according to an example embodiment.

FIG. 6 is a side view illustrating a link assembly according to an example embodiment. In FIG. 6, symbols may be defined as follows.

1) Scalar $l_{ji}$ (j=1, . . . , 7) denotes a length of each segmental link and is known constants determined in a designing process.

2) Notation $L_{ki}$ (k=1,2,35,4,6,7) denotes a segmental link indicated in each image.

3) End-effector corresponds to a ball joint represented by the vector $B_i$ in the example of FIG. 5.

A goal of inverse kinematics is to obtain, when desired position and posture of a sample holder is determined, an equation that expresses positions of a pair of an upper sliding link and a lower sliding link, for example, links $L_{1i}$ and $L_{6i}$, which are capable of making the posture. A derivation of such inverse kinematics may be accessible in the following order.

Figure 7:
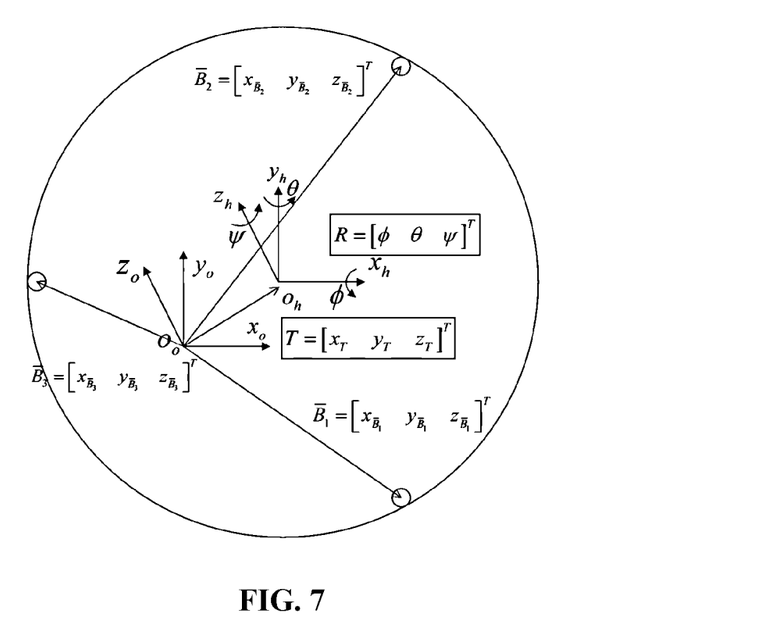
FIG. 7 is a diagram illustrating translational or rotational movements of a sample holder according to an example embodiment.

FIG. 7 is a diagram illustrating translational or rotational movements of a sample holder according to an example embodiment. A translational movement and a rotational movement of the sample holder may be defined as described with reference to FIG. 7. In FIG. 7, symbols may be defined as follows.

1) Coordinate system $[o_h\ x_h\ y_h\ z_h]^T$: local coordinate system fixed to a sample holder. Although the center of the sample holder is positioned at the center of the global coordinate system in the example of FIG. 5, referring to FIG. 7, the two centers do not coincide due to the translational movement of the sample holder.

2) Vector $T = [X_T\ Y_T\ z_T]^T$: a vector indicated by an error from $o_o$ toward $o_h$ to express an amount of translational movement of the sample holder, wherein elements respectively represent an amount of translational movement performed from $o_o$ in directions of axes $x_o$, $y_o$, $z_o$.

3) Vector $R = [\phi, \theta\psi]^T$: a vector that expresses an amount of rotational movement of the sample holder as indicated by arrows on axes of the coordinate system $[o_h\ x_h\ y_h\ z_h]^T$, wherein elements respectively represent an amount of rotational movement performed about the axes $x_o\ y_o\ z_o$.

4) Vector $\overline{B}_i = [x_{\overline{B}_i} y_{\overline{B}_i} z_{\overline{B}_i}]^T$: a vector that expresses a position of a ball-joint of an i-th connecting bar of the sample holder after the translational movement and/or the rotational movement based on $o_o$.

Through this, the position and the posture of the sample holder may be expressed by vectors $T = [X_T\ Y_T\ z_T]^T$ and $R = [\phi\ \theta\ \psi]^T$ as shown in FIG. 7.

The position of the ball joint obtained on the global coordinate system after the translational movement and/or the rotational movement may be understood as a position at which the ball joint is to be positioned by a user to control the sample holder to be at desired position and posture. Thus, the position of the ball joint may be a first calculation to be performed to solve a second inverse kinematics, which may be obtained through the following operations.

1) The vector T is defined by determining a desired position of the sample holder.

2) The vector R is defined by determining a desired posture of the sample holder.

3) The vector $B_L$ of the position of the ball joint is verified at an initial position given by design.

4) A translation-to-rotation converted vector $\overline{B}_i$ is obtained by multiplying the vector $B_1$ by a transformation matrix defined as follows.

$$\begin{bmatrix} \overline{B}_i \\ 1 \end{bmatrix} = \overline{R} \begin{bmatrix} B_i \\ 1 \end{bmatrix} \qquad \text{[Equation 1]}$$

Here, a matrix $\overline{R}$ is a transformation matrix and defined as follows.

$$\overline{R} = \begin{bmatrix} c(\theta)c(\psi) & s(\phi)s(\theta)c(\psi)+c(\phi)s(\psi) & -c(\phi)s(\theta)c(\psi)+s(\phi)s(\psi) & x^T \\ -c(\theta)c(\psi) & -s(\phi)s(\theta)s(\psi)+c(\phi)sc\psi & c(\phi)s(\theta)s(\psi)+s(\phi)c(\psi) & y^T \\ s(\theta) & -s(\phi)c(\theta) & c(\phi)c(\theta) & z^T \\ 0 & 0 & 0 & 1 \end{bmatrix} \qquad \text{[Equation 2]}$$

Using Equations 1 and 2, the position of the ball joint for implementing the desired position and posture of the sample holder may be obtained as the vector $\overline{B}_i$.

Figure 8:
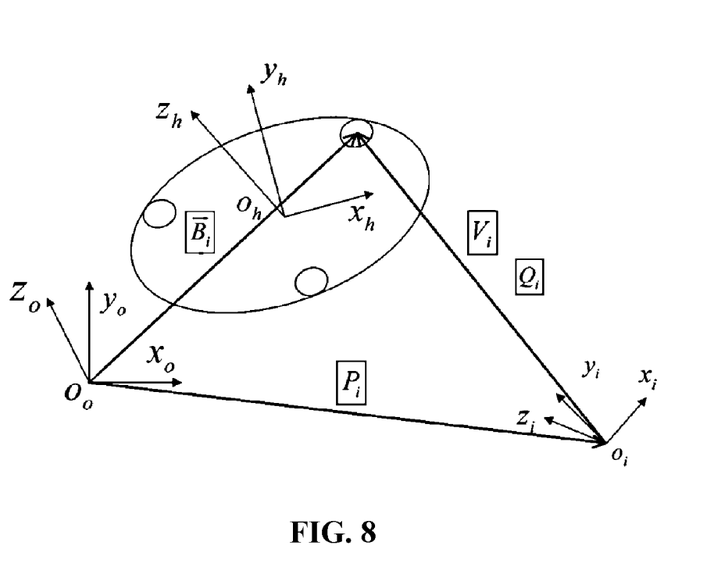
FIG. 8 is a diagram illustrating a position of a ball joint of an i-th connecting bar viewed from a local coordinate system of an i-th link assembly according to an example embodiment.

FIG. 8 is a diagram illustrating a position of a ball joint of an i-th connecting bar viewed from a local coordinate system of an i-th link assembly according to an example embodiment.

In the foregoing examples, a position at which a ball joint is to be positioned on a global coordinate system to allow a sample holder to be at desired position and posture may be calculated. However, since the position of the ball joint is to be determined based on a position of a pair of upper and lower link assemblies, the position of the ball joint on the global coordinate system may need to be converted into a position on a local coordinate system. Such conversion may be obtained through the following coordinate conversion, and related description is made with reference to FIG. 8.

1) As discussed above, a vector $\overline{B}_i$ is calculated.

2) A vector $P_i$ from a center $o_o$ of the global coordinate system to a center $o_f$ of the local coordinate system of an i-th link assembly.

3) A position $V_i = [x_{V_i} y_{V_i} z_{V_i}]^T$ of a ball joint of an i-th connecting bar based on the local coordinate system using a vector difference as shown below (refer to FIG. 8).

$$V_i = \overline{B}_i - P_i \qquad \text{[Equation 3]}$$

As such, based on the global coordinate system, a positional vector from an origin of the local coordinate system to the ball joint of the i-th connecting bar of the i-th link assembly may be calculated using Equation 3. $V_i$ may be converted into an original vector as follows.

4) A conversion matrix is defined as shown below.

$$R_i = \begin{bmatrix} c(\theta)c(\psi) & s(\phi)s(\theta)c(\psi)+c(\phi)s(\psi) & -c(\phi)s(\theta)c(\psi)+s(\phi)s(\psi) \\ -c(\theta)s(\psi) & -s(\phi)s(\theta)s(\psi)+c(\phi)c(\psi) & c(\phi)s(\theta)s(\psi)+s(\phi)c(\psi) \\ s(\theta) & -s(\phi)c(\theta) & c(\phi)c(\theta) \end{bmatrix}$$

[Equation 4]

Here, angles $\phi$, $\theta$, and $\psi$ may be applied to correspond to an i-th ordinal position.

5) A rotation variation is defined by a kinetic structure as follows.

5-1) Based on a Z axis: a first link assembly is at 150 degrees, a second link assembly is at 270 degrees, and a third link assembly is at 30 degrees.

5-2) Based on a Y axis: all link assemblies are at –90 degrees.

6) By rotationally converting $V_i$ at the angle defined in the process 5), based on a local coordinate system of the i-th link assembly, a vector $Q_i$ form an origin of the local coordinate system of the i-th link assembly to a center of a ball joint of the i-th connecting bar may be calculated as shown below.

$$Q_i = \hat{R}_i V_i \quad \text{[Equation 5]}$$

Figure 9:
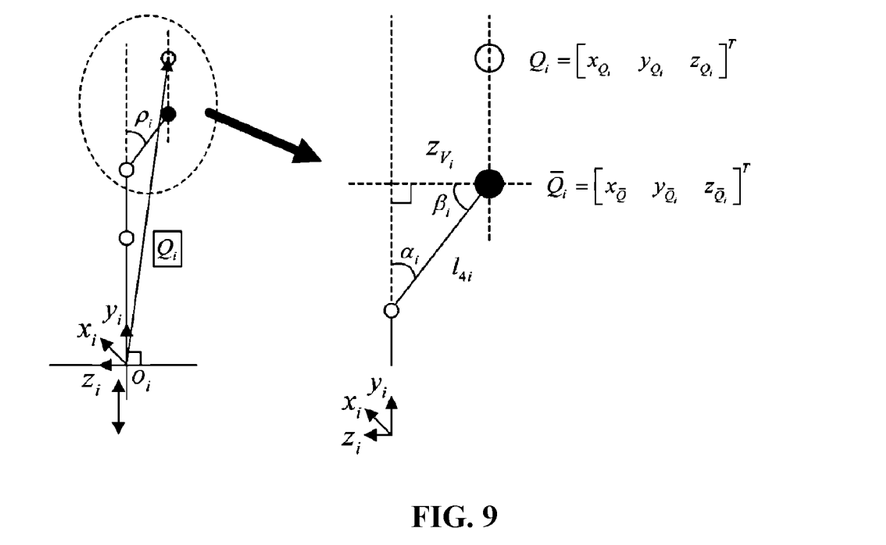
FIG. 9 is a diagram illustrating an example of calculating a gradient of an i-th connecting bar viewed from a local coordinate system of an i-th link assembly according to an example embodiment.

Hereinafter, a process of calculating a gradient of a connecting bar $L_{4i}$ will be described. Referring back to FIG. 6, the connecting bar to be used for controlling the sample holder may be understood as a form having an end to which an end-effector in a form of ball joint connected to the sample holder is attached. In this example, a goal may be to find positions of the links $L_{1i}$ and $L_{6i}$ such that the end-effector is positioned at a desired position on a three-dimensional (3D) space. A solution will be described with reference to FIG. 9. FIG. 9 is a diagram illustrating an example of calculating a gradient of an i-th connecting bar viewed from a local coordinate system of an i-th link assembly according to an example embodiment. As illustrated in FIG. 9, when a target position, for example, $Q_i$ of the end-effector is given, a rotation angle $\alpha_i$ of $L_{4i}$ for achieving the target position may be obtained in the following order.

1) A calculation is performed in the aforementioned order.

2) A position vector $Q_i$ of a desired end-effector viewed from the local coordinate system of the i-th link assembly, which is obtained in a process 1) is verified.

3) Since an element $z_{Q_i}$ of the vector $Q_i$ needs to be the same as a z-axial coordinate $z_{\bar{Q}_i}$ of the end-effector, one side of a right triangle of FIG. 9 is denoted by $z_{\bar{Q}_i}$.

4) Since a length $l_{4i}$ of the connecting bar $L_{4i}$ to which the rotating end-effector is attached is a known constant in a kinetic designing process, a hypotenuse of the right triangle of FIG. 9 is denoted by $L_{4i}$.

5) $\beta_i$ is obtained using $$\cos^{-1}\left(\frac{z_{Q_i}}{l_{4i}}\right) = \beta_i.$$

6) The rotation angle $\alpha_i$ is obtained from the following relationship.

$$180 - 90 - \beta_i = \alpha_i$$

The inverse kinematics may be obtained as follows. In the example of FIG. 8, when the desired position of the ball joint is given, the rotation angle $\alpha_i$ at which the connecting bar attached to the end-effector is to be positioned may be

[Equation 4]

obtained to satisfy the desired position. Using this, the 3D inverse kinematics may be converted into a 2D problem as shown below.

1) The rotation angle $\alpha_i$ of the connecting bar $L_{4i}$ is verified.

2) The length $\bar{l}_{4i}$ of the connecting bar $L_{4i}$ used on a plane $y_i$ of the local coordinate system of the link assembly may be obtained using the following equation.

$$\bar{l}_{4i} = l_{4i} \cos \alpha_i \quad \text{[Equation 6]}$$

Figure 10:
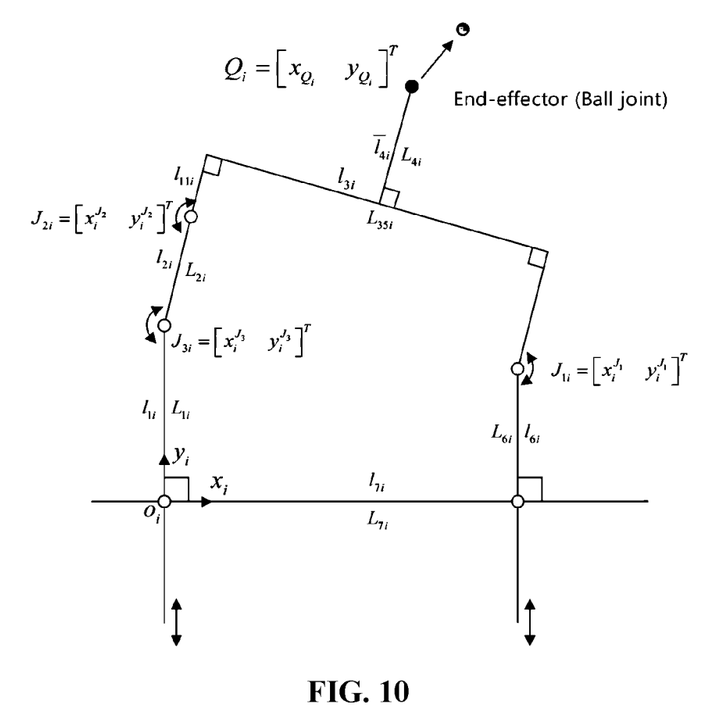
FIG. 10 is a diagram illustrating a load structure on a two-dimensional plane for a final inverse kinematic calculating according to an example embodiment.
Figure 11:
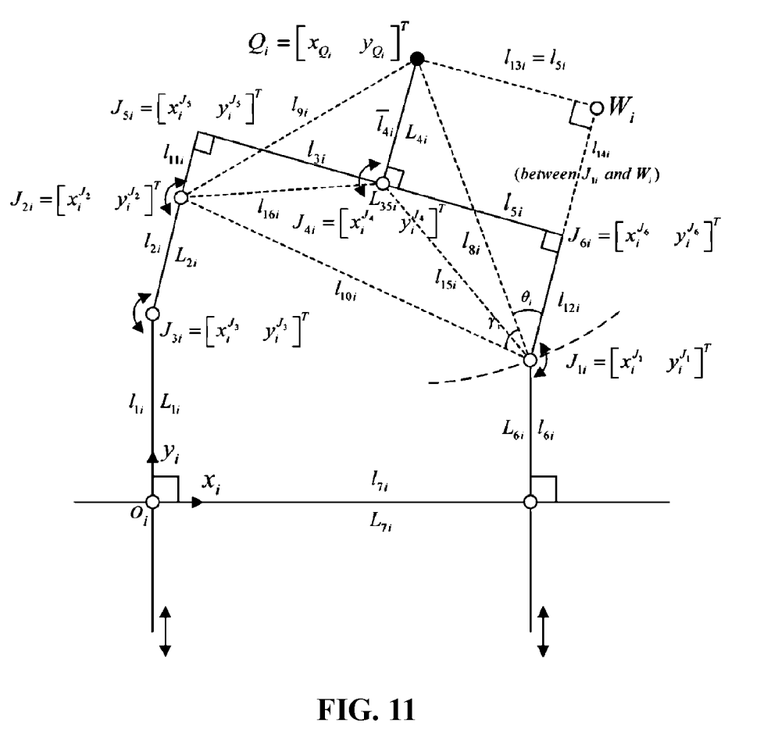
FIG. 11 is a diagram illustrating a relationship of when an endpoint of a link reaches a target point according to an example embodiment.

FIG. 10 illustrates a link assembly converted to a 2D inverse kinematics problem through a projection onto the plane $y_i$ and FIG. 11 illustrates a relationship of when an end-effector of the link assembly projected onto a 2D plane reaches the desired position $Q_i$. Referring to FIGS. 10 and 11, the inverse kinematics for positioning the end-effector to the desired position $Q_i$ along an arrow of FIG. 10 may be obtained in the following order.

3) In terms of obtaining a position of a joint $J_{1i}$, when the end-effect reaches a target point corresponding to $Q_i$, it can be known from FIG. 11 that the position of the joint $J_{1i}$ is one of intersection points between (i) an equation of a circle with a center $Q_i$ and a radius $l_{8i}$ and (ii) an equation of a straight line representing the link $L_{61}$, and the equation of (i) and the equation of (ii) are defined as shown below.

Circle equation: $(x_1^{J_1} - x_{Q_i})^2 + (y_i^{J_1} - y_{Q_i})^2 = l_{8i}^2$ [Equation 7]

Line equation: $x_i^{J_1} = l_{7i}$ [Equation 8]

Here, to obtain a length of $l_{8i}$, a vertical point $W_i$ of FIG. 11 is defined. A vertical line $l_{13i}$ from $Q_i$ to $W_i$ may be the same as $l_{8i}$, and a vertical line $l_{14i}$ from the joint $j_{1i}$ to $W_i$ may be the same as $\bar{l}_{4i} + l_{12}$. Accordingly, the length $l_{8i}$ may be obtained using the following equation.

$$l_{8i} = \sqrt{l_{5i}^2 + (\bar{l}_{4i} + l_{12i})^2}$$

4) The intersection points are obtained by simultaneously solving the equation of (i) and the equation of (ii) in the process 3). When applying Equation 8 to Equation 7, the following equations may be obtained.

$$\Rightarrow (l_{7i} - x_{Qi})^2 + (y_i^{J_1} - y_{Qi})^3 = l_{8i}^2 \quad \text{[Equation 9]}$$

$$\Rightarrow (l_{7i} - x_{Qi})^2 + (y_i^{J_1})^2 - 2yQ_i y_i^{J_1} + yQ_i^2 = l_{8i}^2 \quad \text{[Equation 10]}$$

$$\Rightarrow (y_i^{J_1})^2 - 2yQ_i y_i^{J_1} + (l_{7i} - x_{Qi})^2 + yQ_i^2 - l_{8i}^2 = 0 \quad \text{[Equation 11]}$$

$$\Rightarrow A_i^{J_1}(y_i^{J_1})^2 + B_i^{J_1} y_i^{J_1} + C_i^{J_1} = 0 \quad \text{[Equation 12]}$$

Here, symbols are represented by Equation 13 below.

$$\Rightarrow A_i^{J_1} = 1, B_i^{J_1} = -2yQ_i, C_i^{J_1} = (l_{7i} - x_{Q_1})^2 + yQ_i^2 + l_{8i}^2 \quad \text{[Equation 13]}$$

When solving Equation 12 using quadratic formula, coordinates of the joint $J_{1i}[x_i^{J_1} \; y_i^{J_1}]^T$ may be obtained as follows.

$$x_i^{J_1} = l_{7i} \quad \text{[Equation 14]}$$

$$y_i^{J_1} = \max\left\{\frac{-B_i^{J_1} \pm \sqrt{\left(B_i^{J_1}\right)^2 - 4A_i^{J_1} C_i^{J_1}}}{2A_i^{J_1}}\right\} \quad \text{[Equation 15]}$$

$A_i^{J_1}$, $B_i^{J_1}$, $C_i^{J_1}$ are defined in Equation 13, and $l_{8i} = \sqrt{l_{5i}^2 + (l_{4i} + l_{12i})^2}$.

5) To obtain a position of a joint $J_{2i}$, two circles having $Q_i$ and the joint $J_{1i}$ as the center are considered. The position of the joint $J_{2i}$ may be one of two intersection points of the two circles having $Q_i$ and the joint $J_{1i}$ as the center and radiuses $J_{9i}$ and $h_{10i}$. Equations of the two circles may be expressed as shown below.

Circle equation 1: $(x_i^{J_2} - x_{Q_i})^2 + (y_i^{J_2} - y_{Q_i})^2 = l_{9i}^2$ [Equation 16]

Circle equation 2: $(x_i^{J_2} - x_i^{J_1})^2 + (y_i^{J_2} - y_i^{J_1})^2 = l_{10i}^2$ [Equation 17]

6) The intersection points of the equations of the two circles are calculated using the following equations.

$$\begin{cases} x_i^{J_2} = x_{Q_i} + \dfrac{ek}{p} + \dfrac{f}{p}\sqrt{l_{9i}^2 - k^2} \\ y_i^{J_2} = y_{Q_i} + \dfrac{fk}{p} - \dfrac{e}{p}\sqrt{l_{9i}^2 - k^2} \end{cases} \quad \text{[Equation 18]}$$

$$\begin{cases} x_i^{J_2} = x_{Q_i} + \dfrac{ek}{p} - \dfrac{f}{p}\sqrt{l_{9i}^2 - k^2} \\ y_i^{J_2} = y_{Q_i} + \dfrac{fk}{p} + \dfrac{e}{p}\sqrt{l_{9i}^2 - k^2} \end{cases} \quad \text{[Equation 19]}$$

Here, $e = x_i^{J_1} - x_{Q_i}$, $f = y_i^{J_1} - y_{Q_i}$, $p = \sqrt{e^2 + f^2}$, and $$k = \frac{1}{2p}\left(p^2 + l_{9i}^2 - l_{10i}^2\right).$$

since the circles have the two intersection points, two solutions may be obtained as shown above. Between the solutions, an x-coordinate value may be employed.

7) A position of a joint $J_{3i}$ may be obtained through the processes 3) and 4). For example, intersection points may be obtained after an equation of a circle having the position of the joint $J_{2i}$ as the center and a radius $l_{2i}$ and an equation of a straight line representing the link $L_{1i}$ are defined as shown below.

Circle equation: $(x_i^{J_3} - x_i^{J_2})^2 + (y_i^{J_3} - y_i^{J_2})^2 = l_{2i}^2$ [Equation 20]

Line equation: $x_i^{J_3} = 0$ [Equation 21]

The following equation may be obtained by simultaneously solving the above two equations.

$\Rightarrow A_i^{J_3}(y_i^{J_3})^2 + B_i^{J_3} y_i^{J_3} + C_i^{J_3} = 0$ [Equation 22]

Here, symbols are represented as shown in Equation 23.

$A_i^{J_3} = 1, B_i^{J_3} = -2y_i^{J_2}, C_i^{J_3} = (x_i^{J_2})^2 + (y_i^{J_2})^2 - l_{2i}^2$ [Equation 23]

When solving Equation 22 using the quadratic formula, coordinates of the joint $J_{3i} = [x_i^{J_3} \; y_i^{J_3}]^T$ may be obtained as follows.

$$x_i^{J_3} = 0 \quad \text{[Equation 24]}$$

$$y_i^{J_3} = \max\left\{\frac{-B_i^{J_3} \pm \sqrt{\left(B_i^{J_3}\right)^2 - 4A_i^{J_3} C_i^{J_3}}}{2A_i^{J_3}}\right\} \quad \text{[Equation 25]}$$

When a position vector $T = [x_T \; y_T \; z_T]^T$ and a posture vector $R = [\phi \; \theta \; \psi]^T$ (refer to FIG. 7) of the sample holder are given, a position of a link assembly for positioning the sample holder at the corresponding position and posture may be obtained using Equation 14, Equation 15, Equation 24, and Equation 25.

8) A position of a joint $J_{4i}$ may be obtained by calculating intersection points of two circles using a method similar to the process 5). Equations of the two circles may be as follows.

Circle equation 1: $(x_i^{J_4} - x_i^{J_1})^2 + (y_i^{J_4} - y_i^{J_1})^2 = l_{15i}^2$ [Equation 26]

Circle equation 2: $(x_i^{J_4} - x_i^{J_2})^2 + (y_i^{J_4} - y_i^{J_2})^2 = l_{16i}^2$ [Equation 27]

A solution may be obtained using the following equations.

$$\begin{cases} x_i^{J_4} = x_i^{J_1} + \dfrac{ek}{p} + \dfrac{f}{p}\sqrt{l_{15i}^2 - k^2} \\ y_i^{J_4} = y_i^{J_1} + \dfrac{fk}{p} - \dfrac{e}{p}\sqrt{l_{15i}^2 - k^2} \end{cases} \quad \text{[Equation 28]}$$

$$\begin{cases} x_i^{J_4} = x_i^{J_1} + \dfrac{ek}{p} - \dfrac{f}{p}\sqrt{l_{15i}^2 - k^2} \\ y_i^{J_4} = y_i^{J_1} + \dfrac{fk}{p} + \dfrac{e}{p}\sqrt{l_{15i}^2 - k^2} \end{cases} \quad \text{[Equation 29]}$$

Here, $e = x_i^{J_2}$, $f = y_i^{J_2} - y_i^{J_1}$, $p = \sqrt{e^2 + f^2}$, and $$k = \frac{1}{2p}\left(p^2 + l_{15i}^2 - l_{16i}^2\right).$$

Since the circles have the two intersection points, two solutions may be obtained as shown above. Between the solutions, a value having a greater y-coordinate value may be employed.

9) A position of a joint $J_{5i}$ may be obtained by calculating intersection points of two circles using a method similar to the process 5). Equations of the two circles may be as follows.

Circle equation 1: $(x_i^{J_5} - x_i^{J_2})^2 + (y_i^{J_5} - y_i^{J_2})^2 = l_{11i}^2$ [Equation 30]

Circle equation 2: $(x_i^{J_5} - x_i^{J_4})^2 + (y_i^{J_5} - y_i^{J_4})^2 = l_{3i}^2$ [Equation 31]

A solution may be obtained using the following equations.

$$\begin{cases} x_i^{J_5} = x_i^{J_2} + \dfrac{ek}{p} + \dfrac{f}{p}\sqrt{l_{11i}^2 - k^2} \\ y_i^{J_5} = y_i^{J_2} + \dfrac{fk}{p} - \dfrac{e}{p}\sqrt{l_{11i}^2 - k^2} \end{cases} \quad \text{[Equation 32]}$$

$$\begin{cases} x_i^{J_5} = x_i^{J_1} + \dfrac{ek}{p} - \dfrac{f}{p}\sqrt{l_{11i}^2 - k^2} \\ y_i^{J_5} = y_i^{J_1} + \dfrac{fk}{p} + \dfrac{e}{p}\sqrt{l_{11i}^2 - k^2} \end{cases} \quad \text{[Equation 33]}$$

Here, $e=x_i^{J_4}-x_i^{J_2}$, $f=y_i^{J_4}-y_i^{J_2}$, $p=\sqrt{e^2+f^2}$, and $$k = \frac{1}{2p}(p^2 + l_{1i}^2 - l_{3i}^2).$$

Since the circles have the two intersection points, two solutions may be obtained as shown above. Between the solutions, a value having a greater y-coordinate value may be employed.

10) A position of a joint $J_{4i}$ may be obtained by calculating intersection points of two circles using a method similar to the process 5). Equations of the two circles may be as follows.

Circle equation 1: $(x_i^{J_6}-x_i^{J_1})^2+(y_i^{J_6}-y_i^{J_1})^2=l_{12i}^2$ [Equation 34]

Circle equation 2: $(x_i^{J_6}-x_i^{J_4})^2+(y_i^{J_6}-y_i^{J_4})^2=l_{5i}^2$ [Equation 35]

A solution may be obtained using the following equations.

$$\begin{cases} x_i^{J_6} = x_i^{J_1} + \frac{ek}{p} + \frac{f}{p}\sqrt{l_{12i}^2 - k^2} \\ y_i^{J_6} = y_i^{J_1} + \frac{fk}{p} - \frac{e}{p}\sqrt{l_{12i}^2 - k^2} \end{cases}$$ [Equation 36]

$$\begin{cases} x_i^{J_6} = x_i^{J_1} + \frac{ek}{p} - \frac{f}{p}\sqrt{l_{12i}^2 - k^2} \\ y_i^{J_6} = y_i^{J_1} + \frac{fk}{p} + \frac{e}{p}\sqrt{l_{12i}^2 - k^2} \end{cases}$$ [Equation 37]

Here, $e=x_i^{J_4}-x_i^{J_1}$, $f=y_i^{J_4}-y_i^{J_1}$, $p=\sqrt{e^2+f^2}$, and $$k = \frac{1}{2p}(p^2 + l_{12i}^2 - l_{5i}^2).$$

since the circles have the two intersection points, two solutions may be obtained as shown above. Between the solutions, a value having a greater x-coordinate value may be employed.

A component described in any one of the example embodiments and a component including a common function or feature will be described using the same names in other example embodiments. Unless otherwise stated, the description in any one of the example embodiments may be applicable to other example embodiments, and a detailed description will be omitted in an overlapping range.

Figure 12:
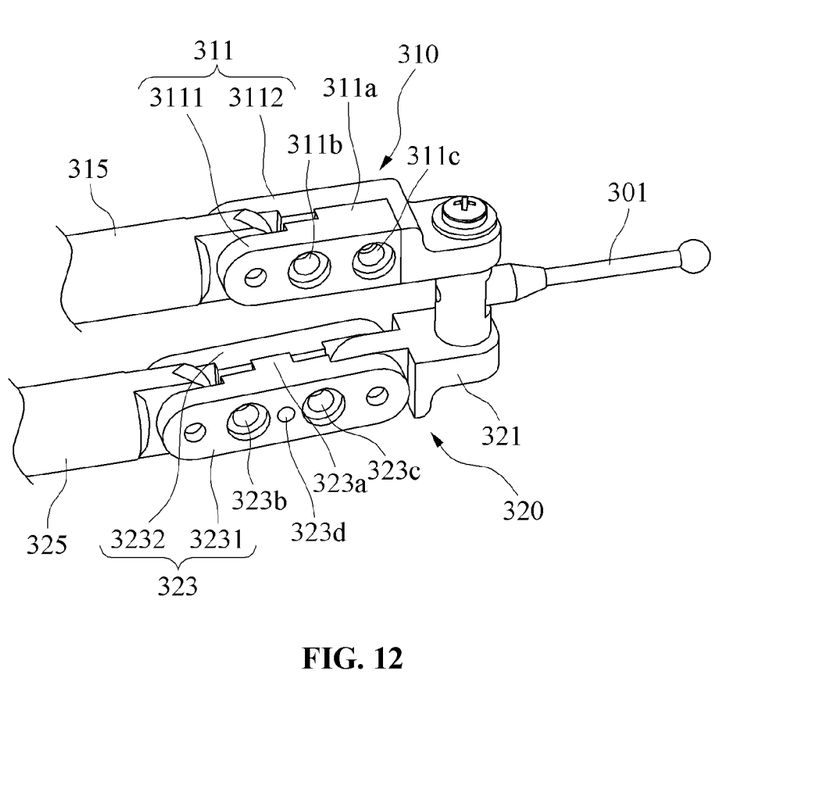
FIG. 12 is a perspective view illustrating a driving module according to an example embodiment.

FIG. 12 is a perspective view illustrating a driving module according to an example embodiment.

Referring to FIG. 12, a driving module may include the connecting bar 301 and the two link assemblies 310 and 320 respectively connected to an upper side and a lower side of the connecting bar 301.

The upper link assembly 310 may include the upper connection link 311 and the upper sliding link 315. The lower link assembly 320 may include the lower connection link 321, the intermediate link 323, and the lower sliding link 325.

The upper connection link 311 may include two split links, for example, a first split link 3111 and a second split link 3112 coupled laterally about the upper sliding link 315. Also, the upper connection link 311 may include a first support 311a between the first split link 3111 and the second split link 3112 such that a space is formed between at least a portion of the first split link 3111 and at least a portion of the second split link 3112. As illustrated in FIG. 12, the first support 311a may be a protrusion protruding from the first split link 3111 toward the second split link 3112. The first support 311a may be formed in the second split link 3112, or provided as an element separate from the first split link 3111 and the second split link 3112. The upper connection link 311 may include a first hole 311b penetrating the two split links 3111 and 3112 and not penetrating the first support 311a, and a second hole 311c penetrating the two split links 3111 and 3112 and penetrating the first support 311a. The first hole 311b and the second hole 311c may be fastened with screws, respectively. The screw fastened to the second hole 311c may prevent separation of the two split links 3111 and 3112. The screw fastened to the first hole 311b may adjust the space between the two split links 3111 and 3112, thereby adjusting a fastening force between the upper connection link 311 and the upper sliding link 315.

The intermediate link 323 may include two split links, for example, a third split link 3231 and a fourth split link 3232 coupled laterally about the lower connection link 321 and the lower sliding link 325. Also, the intermediate link 323 may include a second support 323a between the third split link 3231 and the fourth split link 3232 such that a space is formed between at least a portion of the third split link 3231 and at least a portion of the fourth split link 3232. As illustrated in FIG. 12, the second support 323a may be a protrusion protruding from the third split link 3231 toward the fourth split link 3232. The second support 323a may be formed in the fourth split link 3232, or provided as an element separate from the third split link 3231 and the fourth split link 3232. The intermediate link 323 may include a third hole 323b formed behind the second support 323a to penetrate the two split links 3231 and 3232, a fourth hole 323c formed in front of the second support 323a to penetrate the two split links 3231 and 3232, and a fifth hole 323d penetrating the two split links 3231 and 3232 and penetrating the second support 323a. The third hole 323b, the fourth hole 323c, and the fifth hole 323d may be fastened with screws, respectively. The screw fastened to the third hole 323b may adjust a space behind the second support 323a, thereby adjusting a fastening force between the intermediate link 323 the lower sliding link 315. Likewise, the screw fastened to the fourth hole 323c may adjust a space in front of the second support 323a, thereby adjusting a fastening force between the intermediate link 323 and the lower connection link 321.

As illustrated in FIG. 12, longitudinally contacting portions of adjacent links may each have an arc-shaped convex portion or concave portion which allows the adjacent links to smoothly rotate without interfering with each other even when the adjacent links rotates relatively.

Although a few embodiments of the present invention have been shown and described, the present invention is not limited to the described embodiments. Instead, it would be appreciated by those skilled in the art that changes may be made to these embodiments without departing from the principles and spirit of the invention, the scope of which is defined by the claims and their equivalents.

What is claimed is:

1. A driver of a sample holder for an electron microscope, wherein the driver is connected to a sample holder that holds a sample located inside a chamber to drive the sample holder, and the driver includes:
   pairs of a plurality of link assemblies to drive the sample holder by a synchronized motion of the pairs of the plurality of link assemblies or a relative motion of the pairs of the plurality of link assemblies;

wherein the plurality of link assemblies is radially connected to the sample holder;

wherein each of the pairs of the plurality of link assemblies comprises four segmental links sequentially connected to be relatively rotatable, the four segmental links all rotatable on a same two-dimensional (2D) plane;

wherein the four segmental links comprise an upper sliding link and a lower sliding link penetrating the chamber and configured to slidably move relative to the chamber, and the upper sliding link and the lower sliding link are configured to slidably move relative to each other;

wherein the driver further comprises a connection bar having one end rotatably connected to one of two intermediately connected links among the four segmental links and the other end pivotably connected to the sample holder;

wherein the connection bar is ball-jointed to the sample holder; and wherein the driver allows driving of the sample holder in at least 3 translational degrees of freedom and 2 rotational degrees of freedom.

2. The driver of claim 1, wherein a number of the link assemblies is six, and two link assemblies are included in each pair of the plurality of link assemblies.

3. The driver of claim 1, wherein a position of the sample holder is adjusted by the synchronized motion of the pairs of the plurality of link assemblies.

4. The driver of claim 1, wherein a posture of the sample holder is adjusted by the relative motion of the pairs of the plurality of link assemblies.

5. A stage comprising the driver of claim 1.

6. An electron microscope comprising the driver of claim 1.

* * * * *